United States Patent
Komatsu

(10) Patent No.: US 11,860,539 B2
(45) Date of Patent: Jan. 2, 2024

(54) POLYVINYL ACETATE BASED PHOTOPOLYMER

(71) Applicant: SHOWA KAKO CORPORATION, Osaka (JP)

(72) Inventor: Toshifumi Komatsu, Duluth, MN (US)

(73) Assignee: SHOWA KAKO CORPORATION, Suita (JP)

( * ) Notice: Subject to any disclaimer, the term of this patent is extended or adjusted under 35 U.S.C. 154(b) by 0 days.

(21) Appl. No.: 18/249,011

(22) PCT Filed: Oct. 13, 2021

(86) PCT No.: PCT/US2021/054701
§ 371 (c)(1),
(2) Date: Apr. 13, 2023

(87) PCT Pub. No.: WO2022/081652
PCT Pub. Date: Apr. 21, 2022

(65) Prior Publication Data
US 2023/0288803 A1  Sep. 14, 2023

Related U.S. Application Data

(60) Provisional application No. 63/061,443, filed on Oct. 13, 2020.

(51) Int. Cl.
*G03F 7/038* (2006.01)
*C08F 118/08* (2006.01)

(52) U.S. Cl.
CPC .......... *G03F 7/0388* (2013.01); *C08F 118/08* (2013.01); *C08F 2810/30* (2013.01)

(58) Field of Classification Search
CPC .......................... C08F 118/08; C08F 2810/30
See application file for complete search history.

(56) References Cited

U.S. PATENT DOCUMENTS

| | | | |
|---|---|---|---|
| 2,610,120 A | 9/1952 | Minsk et al. | |
| 4,272,620 A | 6/1981 | Ichimura | |
| 4,339,524 A | 7/1982 | Ichimura et al. | |
| 4,564,580 A | 1/1986 | Ichimura et al. | |
| 4,777,114 A | 10/1988 | Ichimura et al. | |
| 2003/0022104 A1* | 1/2003 | Takano | G03F 7/0388 430/326 |
| 2015/0212413 A1* | 7/2015 | Umeda | G03F 7/12 430/286.1 |

FOREIGN PATENT DOCUMENTS

| | | |
|---|---|---|
| CN | 1230568 A | 10/1999 |
| CN | 1248729 A | 3/2000 |
| EP | 92901 A2 | 11/1983 |
| EP | 130804 A2 | 1/1985 |
| EP | 252150 A1 | 1/1988 |
| EP | 0373862 A1 | 6/1990 |
| GB | 203018 A | 9/1923 |
| JP | S55136265 A | 10/1980 |
| JP | S5979246 A | 5/1984 |
| JP | S61230138 A | 10/1986 |
| JP | H11172177 A | 6/1999 |
| JP | 2000122282 A * | 4/2000 |
| JP | 2001051416 A | 2/2001 |
| JP | 2001133976 A | 5/2001 |
| JP | 2001330952 A | 11/2001 |
| JP | 2003107698 A | 4/2003 |

OTHER PUBLICATIONS

English Translation of JP 2000-122282 A; Morigaki Toshio; Published: Apr. 28, 2000 (Year: 2000).*
The International Preliminary Report on Patentability (IPRP) issued in PCT/US2021/054701, dated Apr. 13, 2023, 5 pages.
International Search Report and Written Opinion issued in PCT/US2021/054701, dated Mar. 1, 2022, 8 pages provided.
Office Action issued in Chinese Application No. 202180070409.9, dated Sep. 20, 2023, 11 pages, with English translation.
Notice of Reasons for Rejection issued in Japanese Application No. 2023-522458, dated Aug. 29, 2023, 4 pages, with English translation.

* cited by examiner

*Primary Examiner* — Mark F. Huff
*Assistant Examiner* — Richard David Champion
(74) *Attorney, Agent, or Firm* — HAMRE, SCHUMANN, MUELLER & LARSON, P.C.

(57) ABSTRACT

The present invention discloses a photosensitive composition, comprising polyvinyl acetate (0% saponified) having a styryl type nitrogen-containing heterocyclic groups such as a styrylpyridinium or/and styrylquinolinium that possesses high UV light energy sensitivity with a small photosensitive group content, high solid content, high water resistance, and very sharp imaging characteristics and produced therefrom photosensitive compositions such as a photo-resist, photolithographic plates, screen printing stencil emulsion and film, and abrasion resistant photosensitive emulsion and film, and other photosensitive compositions being used for commercial and industrial applications.

11 Claims, No Drawings

POLYVINYL ACETATE BASED PHOTOPOLYMER

FIELD OF INVENTION

The present invention is a photosensitive polymer composition suitable for the preparation of photoresists, screen printing stencils, relief images, printing plates, photoetching, and photolithography and abrasion resistant photoresists.

THE PRIOR ART

Photosensitive compositions can be suitable for a wide variety of uses, including the preparation of several types of printing forms, including screen printing stencils, and other printing plates; photolithography; and others Water soluble or water processable photosensitive polymer compositions have several advantages, encompassing such aspects as safety in handling, cost, and ease of processing after exposure.

Water processable compositions that have previously been used in one or more applications mentioned above are as follows:

a) Dichromate sensitized water-soluble emulsions. Photocrosslinkable compositions using water soluble emulsions suitable for producing photosensitive compositions are well known in the art. The use of dichromate is diminishing, due to their reliance on toxic metal salts which present severe safety and effluent handling problems as well as the limited shelf life that their "dark reaction" brings to the system.

In addition, water soluble emulsions are photosensitized immediately prior to use by adding a dichromate compound. The compositions have the disadvantage of being supplied as two packs, one consisting of a sensitizer and the other a base emulsion. After mixing, the composition usually has a useful pot-life of a matter of hours when the sensitizer is a dichromate. When sensitized emulsion is stored for longer periods under conditions of normal temperature and humidity, a so-called dark reaction occurs which makes even unexposed areas of the film insoluble in water.

Another disadvantage of dichromate sensitized compositions is the limited life of unexposed screens which is only a few hours.

b) Diazo resins. These are usually diazodiphenylamine/formaldehyde condensation products Photocrosslinkable compositions using diazo resins with polyvinyl alcohol are suitable for producing screen printing stencils which are also well known in the art. Diazo resins, polymeric diazonium salts, were added to water based emulsions immediately prior to use. When mixed with a water-based solution such as polyvinyl alcohol, the composition can produce excellent results. However, as in the use of dichromate, these compositions have the disadvantage of being supplied as two packs, one consisting of a sensitizer and the other a base emulsion. After mixing, the compositions usually have a useful pot-life of a few weeks.

When sensitized emulsion is stored for longer periods under conditions of normal temperature and humidity, as with dichromate, a so-called dark reaction occurs which makes even unexposed areas of the film insoluble in water and also may increase viscosity of the sensitized emulsion to the point of unusableness. Additionally, photoreaction speed of diazo resins is rather slow. Another disadvantage of diazonium salt sensitized compositions as with the use of dichromate, is the limited life of unexposed screens produced from them. The sensitivity of the compositions also varies with temperature, age and relative humidity.

c) Free radical initiated systems. These consist of an initiator capable of forming free radicals when exposed with light, one or more unsaturated monomers or oligomers that contain vinyl unsaturation, and a water-based emulsion. These systems have a double disadvantage of being both oxygen and moisture sensitive, which can lead to exposure speed variations. They can also be heat sensitive and polymerize when stored at elevated temperatures. They also increase surface tackiness to a degree that the use of the material becomes very difficult.

d) Photodimerizable materials. These have the advantage of being fast exposing, and unaffected by moisture, oxygen and heat.

30 U.S. Patent Specification 2610120 describes light sensitive Photocrosslinkable polyvinyl alcohol derivatives obtained by esterifying the hydroxy groups of the polyvinyl alcohol with a cinnamoyl halide. However, the high levels of cinnamoyl groups needed for crosslinking decrease the number of hydroxy groups to such an extent that the compositions derived from them show a remarkable decrease in water developability and are therefore unsuitable for aqueous systems.

Another photodimerizable composition is based on a styrylpyridinium group, possessing a formyl or acetal group which is used to graft to polyvinyl alcohol (saponified or hydrolyzed polyvinyl acetate from 80% to 90%) However, these photodimerizable compositions have the following disadvantages. That is, these photodimerizable compositions show high photo-sensitivities but poor water-resisting properties. Therefore, they can be swelled at the stage of development resulting in an insufficient resolution and poor image acuity.

Specifically European Patent Specification 252150 highlights another disadvantage of compositions of the type described in British Patent Specification 203018. In particular, the adhesion of cured compositions containing grafted polyvinyl alcohol of the types described in these specifications have insufficient adhesion to form stencils and this can cause peeling of the cured stencil during development by spraying with water.

British Patent Specification 2030575 describes photodimerizable compositions containing polyvinyl alcohol having grafted N-methylstyrylpyridinium groups. These groups overcome disadvantages of grafted cinnamate groups since they maintain the solubility of the polyvinyl alcohol when grafted at relatively low levels. N-methylstyrylpyridinium groups are self-sensitizing, but the level of N-methylstyrylpyridinium groups which can be grafted while maintaining water solubility is very limited. However, a modest degree of photosensitivity can be achieved at relatively low concentrations, 1-2 mol % based on a unit mole of polyvinyl alcohol. The photodimerizable composition therefore retains many of the properties of the original polyvinyl alcohol. One consequence of this as in the cases of other polyvinyl alcohol grafted with a styryl pyridinium group is that crosslinked stencils are not water resistant and cause swelling of the stencils resulting in the loss of the stencils and the loss of the stencil image resolution as stated before.

European Patent Specification 92901 describes polyvinyl alcohol having pendant chalcone groups as photocrosslinkable groups. These photosensitive compositions can be prepared in high yield from readily available and inexpensive starting materials, and their structures can easily be varied in order to select a U.V. absorption wavelength at or about a desired value to match the spectral emission characteristics of the light source used for exposure. However, these compositions have the disadvantage that the rate of photocrosslinking is slow, requiring long exposure times when printing screens are being made.

European Patent Specification 130804 describes compositions including polyvinyl alcohol having grafted N-methylstyrylpyridinium groups, a free-radical photopolymerizable, ethylenically-unsaturated compound, and a free-radical photopolymerization initiator. Water-dispersible polymers or hydrophobic polymers can also be added. These compositions produce stencils which have good solvent resistance, water resistance and abrasion resistance. The use of polyvinyl alcohol with grafted N-methylstyrylpyridinium groups serves to facilitate dispersion of the photopolymerizable unsaturated compound but again the base polymer used here is polyvinyl alcohol (80-90% hydrolyzed PVAc) grafted with the styrylpyridinium groups.

One of the uses of this invention as mentioned above is to produce screen printing stencils. In screen printing a negative of a print design, known as a stencil, is produced on a mesh of a polymer (usually a polyester) or of stainless steel stretched over a wooden or metal frame, the areas of mesh where printing is not to be effected (stencil areas) being covered with a material impervious to the ink to be used for the printing.

Many methods have been proposed for the production of screen printing stencils. Stencils can be prepared either independently of the screen, by the indirect film method, or on the screen itself by the direct method.

In the indirect method, a photosensitive layer is coated on to a temporary support sheet, usually a transparent polyester sheet, and following exposure to actinic light the layer is developed on the support sheet using water to remove unexposed areas of the photosensitive layer. The wet stencil on its support is then adhered to the screen mesh by the application of gentle, even pressure, and, after drying, the support sheet is removed, leaving the stencil on the screen mesh ready for printing.

In the direct method, a photosensitive emulsion is coated on to a mesh and dried to give a continuous, even film. A stencil is then produced by imaging the coating photographically through a line or half tone photopositive and then developing an image with a spray of water, again to remove unexposed areas of the film.

An another technique, the so-called capillary film method, involves the application of a photosensitive layer to a polyester sheet which is then transferred to a mesh prior to imaging. Imaging and development are then done as described for the direct method. Combinations of emulsions and films are also possible in which a direct emulsion is used to adhere a film to a mesh. Development of the stencil is then as with the direct method.

The photosensitive coatings for all these techniques are polymer-based, and their formulation is important to achieve chemical, physical, and thermal resistance in screen printing.

DETAILED DESCRIPTION OF THE PRESENT INVENTION

In accordance with this invention, it is now possible to provide a photosensitive polymer composition of aqueous emulsion type in which the above-mentioned problems encountered in conventional techniques are addressed, and which can produce a photo-hardened product having good water resistance and abrasion resistance and has excellent photo-sensitivity and image resolving power. Accordingly, the present invention provides a photosensitive polymer composition in the form of an aqueous emulsion comprising a non-hydrolyzed or non-saponified vinyl acetate polymer (polyvinyl acetate) added with a styrylpyridinium and/or styrylquinolinium group. The term "addition" means a chemical addition. By the term "vinyl acetate polymer" herein is meant to be polyvinyl acetate also note as PVAc, and a copolymer of vinyl acetate with a monomer. In the case where the vinyl acetate polymer is a copolymer, examples of the monomer copolymerizable with vinyl acetate which can be used are ethylene, acrylates such as methyl acrylate and methyl methacrylate, acrylamides such as acrylamide, methacrylamide, N-methylolacrylamide and N,N-dimethylacrylamide, unsaturated carboxylic acids and salts thereof such as acrylic acid, methacrylic acid, crotonic acid, fumaric acid, itaconic acid, maleic acid and salts thereof, and cationic monomers such as dimethylaminoethyl methacrylates, vinylimidazole, vinylpyridine and vinylsuccinimide.

To form a composition for which water development is possible and which gives a hardened product of excellent water resistance after photo-hardening, it is required that polyvinyl acetate is 0% hydrolyzed or 0% saponified. The use of 0% hydrolyzed polyvinyl acetate is the new art instead of using PVAc that is hydrolyzed or saponified to 80-90%, which is polyvinyl alcohol (PVA) as a polymer chain to which a styrylpyridinium or styrylquinolinium group is grafted in the prior art. The styrylpyridinium or styrylquinolinium group-added polymer used in the present invention is prepared by adding a styrylpyridinium and/or styrylquinolinium group to non-hydrolyzed or non-saponified vinyl acetate polymer (PVAc) by an acid catalyzed reaction. The styrylpyridinium-grafted PVA, polyvinyl alcohol which is saponified or hydrolyzed PVAc to 80-90% hydrolysis as disclosed in the prior art and their preparations are known by, for example, U.S. Pat. Nos. 4,339,524, 4,564,580, and 4,272,620. In the prior art it is stated that the ratio of grafting of the styrylpyridinium or styrylquinolinium group to PVA (polyvinyl alcohol) to be 0.5-20 mole % based on a unit mole of PVA. But in actual practice, when the grafting ratio to PVA (degree of polymerization is between 1700 and 2400) is lower than 1 mole %, a water-soluble photo-dimerizable PVA polymer having a desirable photocrosslinking property cannot be obtained because of inadequate photo-hardening due to insufficient amount of grafted styryl groups. Also when the styryl groups are added to PVA (degree of polymerization between 1700 and 2400) at a mole % of over 1.8, the grafted PVA solution increase its viscosity greatly to the point of gelation at room temperature.

According to the present invention, when 0.05%-0.20 mole % based on a unit mole of PVAc of the photodimerizable group is added to non-saponified PVAc, photo-crosslinking or photo-dimerization is more than adequate to create very water-resistant hardened material.

In accordance with the present invention Examples of the compound of to be added to non-hydrolyzed PVAc(polyvinyl acetate) emulsion include but not limited to: 1-methyl-2-(p-formylstyryl)pyridinium, 1-methyl-4-(p-formylstyryl)pyridinium, 1-ethyl-2-(p-formylstyryl)pyridinium, 1-ethyl-4-(p-formylstyryl)pyridinium, 1-allyl-4-(p-formylstyryl)pyridinium, 1-(2-hydroxyethyl)-2-(p-formylstyryl)pyridinium, 1-(2-hydroxyethyl)-4-(p-formylstyryl)pyridinium, 1-carbamoylmethyl-2-(p-formylstyryl)pyridinium, 1-carbamoylmethyl-4-(p-formylstyryl)pyridinium, 1-methyl-2-(m-formylstyryl)pyridinium, 1-benzyl-2-(p-formylstyryl)pyridinium, 1-benzyl-4-(p-formylstyryl)pyridinium, 1-methyl-4-(p-formylstyryl)-5-ethylpyridinium, 1-methyl-2-(p-formylstyryl)quinolinium, 1-ethyl-2-(p-formylstyryl)quinolinium and 1-ethyl-4-(p-formylstyryl)quinolinium.

The invention can be further modified by formulating with other materials such as free radical polymerization materials (one or more unsaturated monomers or oligomers that contain vinyl unsaturation and initiators capable of forming free radicals when exposed with light), polyvinyl alcohol (hydrolyzed PVAc to 70-90%) grafted with photosensitive groups, non-light sensitive components such as non-photosensitive polyvinyl alcohol and polyvinyl acetate emulsion, diazo resins, other compatible polymer systems, surfactants, biocide, and pigments.

As it can be clearly understood regarding this invention from the description of the prior art information above, the striking discovery is that styryl pyridinium and/or styryl quinolinium group are added to non-hydrolyzed PVAc whereas all the prior art photosensitive compositions of this type are made with polyvinyl alcohol, made by hydrolyzing PVAc to 80-90%, grafted with styryl pyridinium or styryl quinolinium compound.

The polyvinyl acetate used in this invention is 0% saponified or 0% hydrolyzed polyvinyl acetate, preferably a polyvinyl acetate homopolymer which is added with the photodimerizable group of the styryl base in the presence of an acid catalyst. The reaction is usually carried out at a pH of around 2.0 using hydrochloric, sulfuric, phosphoric or an organic sulphonic acid. The reaction is usually carried out at about 50° C. for a period of 4-8 hours. However, the time and temperature can be varied a great deal, if required. The reaction can be carried out at room temperature also. When the reaction is completed, the reaction mixture is then quenched by an alkaline solution such as potassium hydroxide, sodium hydroxide, or ammonia water to pH of around 7.

The invention is very adaptable in that it can be changed in terms of photoreaction speed, and UV light absorption property by changing mole % added to PVAc; and changing the ratio between styrylpyridinium and styrylquinolinium group, so that the invention can be used for various industrial applications with many types of exposure equipment such as direct-to-plate with UV laser, UV-LED, and other light sources.

Photosensitive polymer compositions comprised of the present invention have a very high photo reactivity, allowing thick layers (100-700 µm) of the photosensitive polymer composition to be hardened throughout the entire thickness of the coating, even with very short exposure time to light of a suitable wavelength. They display a faster photo speed than diazo or polyvinyl alcohol grafted with the photodimerizable group of the styryl base and other systems as described previously. The mechanism of photocross-linking in this patent is by photodimerization, and hence none of the photosensitive polymer compositions characterized by the patent, exhibit the susceptibility to oxygen, moisture and temperature of some other systems.

As previously stated, the most notable and significant part of this invention is that PVAc (polyvinyl acetate) is the base polymer for adding the photodimerizable group of the styryl base unlike previously noted use of polyvinyl alcohol which is hydrolyzed PVAc to 80-90%. It is also significant that the amount of the photodimerizable group of the styryl base can be as little as 0.05-0.5 mole % based on a unit mole of PVAc. Even with the very small amount of the photosensitive group added to PVAc (vinyl acetate polymer), it produces highly water resistant material that has strong adhesion to many types of substrate such as polyester and stainless steel nickel, and various other surfaces with 15-30 mj/cm² UV exposure whereas Polyvinyl alcohol grafted with the same styryl groups at 1-1.5 mole % based on the unit mole of PVA would require over 200 mj/cm² UV exposure to form not-very-water resistant hardened film with very weak adhesion to polyester, stainless steel and other types of materials.

The reaction mechanism under which PVAc and the photodimerizable group of the styryl base are reacted to produce such a photosensitive polymer composition with great water resistance and extremely fast photoreaction speed with such a miniscule amount of photosensitive groups reacted is not clearly understood but it is suspected that the photosensitive groups are reacted with PVAc emulsion in such a way to increase its water resistance upon exposure to UV light to make image development with water possible and the resulting film is extremely water resistant.

The photosensitive polymer compositions described in the present invention are suitable for a very wide range of applications and can be used in photoreactive processes where a resist, stencil or relief image is required, for example as an etching photoresist for various etching applications, as photo-resists for plating processes (preparation of printed circuit boards), photolithographic compositions and as stencils for screen printing stencils as noted previously.

It should also be noted that there exists a synergistic relationship in terms of photospeed and water resistance of photo-hardened film between styryl pyridinium and styryl quinolinium photosensitive group when they are added to PVAc at the same time. When PVAc reacted with only one photosensitive group is compared to PVAc emulsion reacted with two photosensitive groups, the latter photopolymer is faster in exposure speed by 5-10 mj/cm², and more water resistant than the one with only one photosensitive group In summary, the present invention is a significant improvement over the prior art technologies including the polyvinyl alcohol based photosensitive polymer compositions with the photodimerizable group of the styryl base or diazo based systems in the following aspects:

(1) The use of non-hydrolyzed PVAc (polyvinyl acetate) instead of PVA (polyvinyl alcohol), which is hydrolyzed or saponified
PVAc, which gives higher solid, faster photoreaction, and water resistance
(2) Very fast photo-reaction speed, 4 or 5 times faster than PVA based photosensitive compositions with very low amount of
photosensitive groups, 0.05-0.5 mole % based on a unit mole of PVAc whereas PVA grafted with the same styryl group at 1.0
mole % based on a unit mole of PVA is not adequate to produce water resistant photo-hardened film
(3) High solid content at 50-59% compared to 14-18% of PVA based photosensitive compositions
(4) Highly water resistant but water processable
(5) Very stable composition chemically and physically maintaining photosensitive functionalities, and viscosity without any sign of phase separation for over 12 months
(5) Good base photosensitive composition with which formulating many types of photosensitive compositions to develop various desired functionalities such as very fine image resolution and chemical and physical resistance which may be required in many industrial applications.

(6) Synergistic effect in the use of styryl pyridinium and styryl quinolinium group promoting faster photoreaction and water resistance

EXAMPLES

The following specific examples which contain the best mode known to the inventor further illustrate the invention. All parts are by weight unless otherwise stated. These examples are merely illustrative of the invention and are not intended to limit its scope.

Polyvinyl Acetate (PVAC) Vinysol 2501 (manufactured by Daido Chemical Corporation, 50% solid, viscosity=3000 cps, pH=5, particle size=1.2 μm and degree of saponification of 0%) is noted as PVAc in the following examples.

Polyvinyl Alcohol GH-24 (manufactured by Nippon Synthetic Chemical Industry, the degree of polymerization 2400 and the degree of saponification of 88%) is noted as PVA N-Methyl-4-(p-Formylstyryl) pyridinium Methyl Sulfate made as per the published procedures, is noted as SBQ in the following examples.

4-[2-(4-Formylphenyl) Ethynyl]1-Methylquinolinium Methyl Sulfate made as per the published procedures, is noted as 4QP in the following examples.

PVAc added with 4QP is noted as PVAc-4QP

PVAc added with SBQ is noted as PVAc-SBQ

PVAc added with 4QP and SBQ is noted as PVAc-4QP/SBQ

Example 1

0.45 g each of SBQ (0.051 mole % based on a unit mole of PVAc) and 4QP (0.050 mole % based on a unit mole of PVAc) was added to 450 g of PVAc under agitation at 1100 rpm (revolution per minute). Let the mixture mix for 5 min to ensure complete dissolution of SBQ and 4QP. The mixture was heated with agitation to 50° C. When the mixture reached 50° C., 40% phosphoric acid was added to the mixture to adjust the pH to 2. Then mixture was mixed at 50° C. for 8 hours, then heating was stopped, and the mixture was left for 12 hours under agitation without heating. The mixture was quenched with 10% ammonia water to pH of 7 to complete the addition reaction.

Example 2

25 g of SBQ (0.26 mole %) was added to 5 kg of PVAc under agitation at 500 rpm. The mixture was mixed for 30 min to dissolve SBQ. The emulsion was heated to 50° C. Then 40% phosphoric acid was added to the pH of 2 and the emulsion was kept at 50° C. for 8 hours with agitation and the mixture was left for 12 hours under agitation without heating. The mixture was then quenched with 10% potassium hydroxide solution to pH of 7 to complete the addition reaction.

Example 3

0.90 g 4QP (0.10 mole %) was added to 450 g of PVAc under agitation at 1100 rpm. Let the mixture mix for 5 min to ensure complete dissolution of 4QP. The mixture was heated with agitation to 50° C. When the mixture reached 50° C., 40% phosphoric acid was added to the mixture to adjust the pH to 2. Then mixture was mixed at 50° C. for 8 hours, then heating was stopped, and the mixture was left for 12 hours under agitation without heating. The mixture was quenched with 10% ammonia water to pH of 7 to complete the addition reaction Example 4

0.45 g each of SBQ (0.051 mole %) and 4QP (0.050 mole %) was added to 450 g of PVAc under agitation at 1100 rpm. Let the mixture mix for 5 min to ensure complete dissolution of SBQ and 4QP. Then 40% phosphoric acid was added to the mixture to adjust the pH to 2 at room temperature. Then mixing continued for 1 hour and the mixture was left for 3 days without agitation. Then mixture was quenched with 10% ammonia water to pH of 7 at room temperature under agitation to complete the addition reaction.

Example 5

2.25 g (0.256 mole %) of SBQ was added to 450 g of PVAc under agitation at 1100 rpm. Let the mixture mix for 5 min to ensure complete dissolution of SBQ. Then 40% phosphoric acid was added to the mixture at room temperature to adjust the pH to 2. Then mixing continued for 1 hour and the mixture was left for 3 days without agitation. Then mixture was then quenched with 10% potassium hydroxide to pH of 7 under agitation to complete the addition reaction.

Example 6

0.45 g (0.05 mole %) of 4QP was added to 450 g of PVAc under agitation at 1100 rpm. Let the mixture mix for 5 min to ensure complete dissolution of 4QP. Then 40% phosphoric acid was added to the mixture at room temperature to adjust the pH to 2. Then mixing continued for 1 hour and the mixture was left for 3 days without agitation. Then mixture was then quenched with 10% ammonia water to pH of 7 under agitation to complete the addition reaction.

Example 7

0.9 g (0.10 mole %) of 4QP was added to 450 g of PVAc under agitation at 1100 rpm. Let the mixture mix for 5 min to ensure complete dissolution of 4QP. The mixture was heated with agitation to 50° C. When the mixture reached 50° C., 40% phosphoric acid was added to the mixture to adjust the pH to 2. Then mixture was mixed at 50° C. for 8 hours, then heating was stopped, and the mixture was left for 12 hours under agitation without heating. The mixture was quenched with 10% ammonia water to pH of 7 to complete the addition reaction.

Example 8

0.9 g (0.10 mole %) of SBQ was added to 450 g of PVAc under agitation at 1100 rpm. Let the mixture mix for 5 min to ensure complete dissolution of 4QP. The mixture was heated with agitation to 50° C. When the mixture reached 50° C., 40% phosphoric acid was added to the mixture to adjust the pH to 2. Then mixture was mixed at 50° C. for 8 hours, then heating was stopped, and the mixture was left for 12 hours under agitation without heating. The mixture was quenched with 10% ammonia water to pH of 7 to complete the addition reaction.

Example 9 R (Reference)

PVA-SBQ solution was prepared as per the prior-art procedures, by acid catalyzed grafting to PVA (100 g of 13% solution) with 1.2 g of SBQ.(1.37 mole % based on a unit mole of PVA)

All of the photopolymer materials from the examples were coated as is after the completion of the reaction on 150/48 (150 threads per 2.54 cm, 48 µm thread diameter) yellow polyester mesh stretched over aluminum frame, a typical screen used for screen printing, by an emulsion coater once on the print side(front) and once on the squeegee side (back side) resulting in a coating weight of about 4 g, dried, and exposed by 3 kw metal halide lamp exposure equipment at 1 m from the screen. An exposure calculator photopositive was used, so that one exposure trial gives 5 levels of exposure light energy. The exposure calculator photopositive has 50 µm-250 µm lines and spaces. The exposure equipment has a light measuring sensor and measures light energy emitted by metal halide lamp in the equipment (1 light unit=21 mj/cm$^2$ measured by Hamamatsu UV power meter C12144 with UV sensor H12684-385 that measures UV light energy between 320 nm-400 nm). Exposed screens were soaked in water bath for 2 minutes and washed out with fanned spray head and with tap water at room temperature at 10 cm for 1 min. 30 seconds. Water resistance was determined by hitting the hardened image immediately after image development, while the hardened material was still wet, by concentrated stream of high-pressure water approximately at 21.1 kg-force/cm$^2$ for 5 seconds at the distance of 30 cm. The extent of damage was visually checked. The exposed, developed, and dried screens were studied under a video microscope at 40X and 1000X.

TABLE 1

| Examples/Total mole % of photosensitive groups | Exposure Speed (mj/cm$^2$) | Water Resistance | Hardened Image Resolution | Hardened Image Sharpness |
| --- | --- | --- | --- | --- |
| 1/0.11 | 15-21 | very good | 50 µm | well defined |
| 2/0.26 | 21-31 | very good | 50 µm | well defined |
| 3/0.10 | 15-21 | very good | 50 µm | Well defined |
| 4/0.10 | 21-31 | very good | 50 µm | well defined |
| 5/0.26 | 21-31 | very good | 50 µm | well defined |
| 6/0.05 | 21-31 | very good | 50 µm | well defined |
| 7/0.10 | 21-31 | very good | 50 µm | well defined |
| 8/0.10 | 21-31 | very good | 100 µm | well defined |
| 9 R/1.37 | over 200 | very poor | couldn't be determined because hardened image was very poor. | very poor |

As it can be seen in the Table 1, the combination of 4QP (0.05 mole %) and SBQ (0.051 mol %) in the example 1 produced the composition with faster exposure by 6-10 mj/cm$^2$ than 0.1 mole % 4QP (example 3) or 0.1 mole % SBQ (example 8). The combination addition appeared to have a synergistic effect on exposure speed.

Another very significant observation is that PVA-grafted with SBQ at 1.37 mole % was very inferior to the invention in terms of photo hardening speed, water resistance, adhesion to mesh and hardened image sharpness even though PVA was grafted at 1.37 mole and the invention with 0.05-0.25 mole%/. Furthermore, the image created with PVA-SBQ was so poorly defined that proper exposure energy required to make hardened images was very difficult to determine. The image resolution achieved was 100 µm at best whereas all of the examples of this invention were able to resolve 50 µm lines and spaces.

The invention may be used as is for some applications but further compounding with other materials such as PVA-SBQ, PVA, non-photosensitive PVAc homo or copolymer, photopolymerizable ethylenically unsaturated compounds with photopolymerization initiators, other compatible resins as well as surfactants and pigment dispersions to gain specific attributes may be required.

Compounding Examples

Polyvinyl Acetate (PVAC) Vinysol 2501 (manufactured by Daido Chemical Corporation, 50% solid, 3000 cps, pH=5, particle size=1.2 µm and degree of saponification of 0%) is noted as PVAc in the following examples
  PVAc added with 4QP is noted as PVAc-4QP
  PVAc added with SBQ is noted as PVAc-SBQ
  PVAc added with 4QP and SBQ is noted as PVAc-4QP/SBQ
  PVA-SBQ: described in Example 9R (Reference)
  Omniad 819, 184, and 651 photopolymerization initiator (manufactured by IGN B.V.): noted as 819,184, 651
  Pentaerythritol triacrylate, photopolymerizable monomer (Aldrich): noted as PETA
  2-Isopropylthioxanthone((TCI) noted as ITX
  Diazo SY-2(manufactured by Showa Kako Corporation) noted as SY-2

All of the photosensitive compositions were mixed for 8 minutes at 1100 rpm (revolution per minute). The mixes were left untouched over-night to remove all air-bubbles before coating. The mixed and deaerated compositions described in Example 11 through 16 were coated on 300/34 (300 threads per 2.54 cm, 34 µm thread diameter), yellow polyester mesh stretched over aluminum frame by an emulsion coater once on the print side(front) and once on the squeegee side (back side) resulting in the coating weight of about 2 g, dried, and exposed by 3 kw metal halide lamp exposure equipment at 1 m from the screen for 3 light units (63 mj/cm$^2$), 4 light units (84 mj/cm$^2$), and 5 light units (105 mj/cm$^2$) with an exposure calculator photopositive that had 4 level light transmission density filter film, placed on the front side of the screen, so that one exposure trial gives 5 different as describe in the Table2 below.

TABLE 2

|  | 3 light units = 57 mj/cm$^2$ | 4 light units = 74 mj/cm$^2$ | 5 light units = 91 mj/cm$^2$ |
| --- | --- | --- | --- |
| No filter 100% T | 57 mj/cm$^2$ | 74 | 91 |
| 94% T filter | 54 mj/cm$^2$ | 70 | 86 |
| 80% T filter | 46 mj/cm$^2$ | 59 | 73 |
| 60% T filter | 34 mj/cm$^2$ | 44 | 55 |
| 50% T filter | 29 mj/cm$^2$ | 37 | 46 |

Exposure was done under vacuum to ensure tight contact between the photopositive and the front side of the screen to reduce light scattering which reduces image resolution. The exposure calculator photopositive has 50 µm-250 µm lines and spaces. The exposure equipment has a light measuring sensor and measures light energy emitted by metal halide lamp in the equipment (1 light unit=21 mj/cm$^2$ measured by Hamamatsu UV power meter C12144 with UV sensor H12684-385 that measures UV light energy between 320 nm-400 nm). Exposed screens were all washed out with fanned spray head and with tap water at room temperature at 10 cm from the front side of the screen for 1 min. 30 seconds. Water resistance was determined by hitting the hardened image at all five exposure steps immediately after image development, while the hardened material was still wet, by concentrated stream of high pressure water approximately at 21.1 kg-force/cm$^2$ for 5 seconds at the distance of 30 cm from the front of the screen. The extent of damage was visually checked. The exposed, developed (washed out), and dried screens were studied under a video microscope at 40X and 1000X.

Unless otherwise stated, all are in wt. %

Example 10: Noted as RCT

PETA 95.81
819 1.33
184 1.33
651 1.33
ITX 0.2

Example 11

PVAc SBQ from Example 5 15
PVA-SBQ 39
PVAc 46

Example 12

PVAc 4QP/SBQ from Example 1 30
PVA-SBQ 35
PVAc 35

Example 13

PVAc 4QP from Example 3 30
PVA-SBQ 56
PVAc 14

Example 14

PVAc-4QP/SBQ from Example 1 30
PVA-SBQ 60
PVAc 10

Example 15

PVAc-SBQ from Example 5 30
PVA-SBQ 45
PVAc 25

Example 16

PVAc-4QP from Example 7 30
PVA-SBQ 50
PVAc 20

Example 17

PVAc-SBQ from Example 2 35
PVA-SBQ 45
PVAc 20
RC1 10

Reference Example 17

PVA-SBQ 20
PVAc 80

Reference Example 18

PVA-SBQ 35
PVA 20
PVAc 35
Diazo 0.3

Reference Example 19

PVA-SBQ 60
PVA 10

PVAc 30
Diazo 0.3
RC1 10

TABLE 3

| Example | Exposure Speed: mj/cm$^2$ | Water Resistance | Image Resolution: μm | Image Sharpness |
|---|---|---|---|---|
| 11 | 39-41 | Good | 20 | Very Sharp |
| 12 | 44-48 | Good | 20 | Very Sharp |
| 13 | 37-41 | Good | 20 | Very Sharp |
| 14 | 55 59 | Good | 20 | Very Sharp |
| 15 | 37-41 | Good | 20 | Very Sharp |
| 16 | 55-59 | Good | 20 | Very Sharp |
| 17 | 90-100 | Good | 50 | Very Sharp |
| 18 | 220 240 | Poor | 50 | Good |
| 19 | 240-260 | Poor | 50 | Good |

As the experimental results from above examples clearly shows the invention's contribution to the speed of photoreaction, water resistance, and hardened image sharpness. Furthermore, the compositions with the invention were able to resolve 20 μm lines and spaces which is very difficult with conventional composition with PVA-SBQ and/or with diazo. Currently smallest image resolution with the conventional photosensitive materials are limited to 50-100 μm lines and spaces at best.

The forgoing description, examples and data are illustrative of the invention described herein, and they should not be construed to unduly limit the scope of invention or the claims, since many embodiments and variations can be made while remaining within the spirit and scope of the invention. The invention resides in the claims hereinafter appended.

What is claimed is:

1. A photosensitive resin composition in form of an aqueous emulsion comprising:
   a water-based, water-processable, non-saponified, and non-hydrolyzed vinyl acetate polymer to which at least one group selected from the group consisting of a styrylpyridinium group and a styrylquinolinium group has been added, the polymer being obtained by adding from 0.01 to 5 mole % of the at least one group selected from the group consisting of the styrylpyridinium group and the styrylquinolinium group to a vinyl acetate polymer having a polymerization degree in a range from 100 to 5000 and a saponification degree of zero, and the styrylpyridinium group and the styrylquinolinium group being one or more of respective formulae in the following formulae (A) and (B):

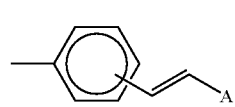
(A)

wherein A represents:

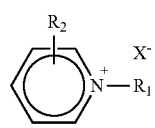

or

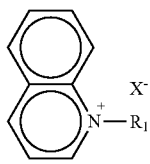

wherein, $R_1$ is a hydrogen atom or an alkyl or aralkyl group which optionally contains a hydroxyl group, a carbamoyl group, an ether bond, or an unsaturated bond; $R_2$ is a hydrogen atom or a lower alkyl group; and $X^-$ is a halide ion, a phosphate ion, a p-toluenesulfonate ion, a methyl sulfate ion, an ethyl sulfate ion, or a mixture of two or more of said ions

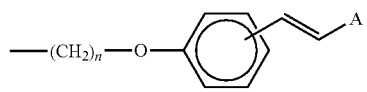

wherein A is:

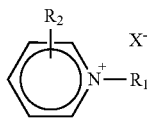

or

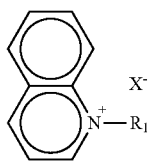

wherein, $R_1$ is a hydrogen atom or an alkyl or aralkyl group which optionally contains a hydroxyl group, a carbamoyl group, ether bond, or an unsaturated bond; $R_2$ is a hydrogen atom or a lower alkyl group; and $X^-$ is a halide ion, a phosphate ion, a p-toluenesulfonate ion, a methyl sulfate ion, an ethyl sulfate ion, or mixture of two or more of said ions.

2. A photosensitive composition comprising:
the photosensitive resin composition of claim 1 and
a water soluble or water dispersible or hydrophobic polymer.

3. A photosensitive composition comprising:
the photosensitive resin composition of claim 1;
a water soluble or water dispersible or hydrophobic polymer;
a photopolymerizable compound having an ethylenically unsaturated group; and
a photopolymerization initiator.

4. A photosensitive composition comprising:
the photosensitive resin composition of claim 1;
a water soluble or water dispersible or hydrophobic polymer;
a photopolymerizable compound having an ethylenically unsaturated group;
a photopolymerization initiator; and
a water soluble diazo compound.

5. A method of manufacturing a photosensitive resin comprising a water-based, water-processable, non-saponified, and non-hydrolyzed vinyl acetate polymer added with at least one group selected the group consisting of a styrylpyridinium group and a styrylquinolinium group that are represented by one or more of respective formulae in the following formulae (A) and (B):

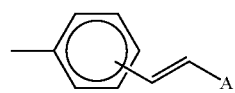

wherein A represents:

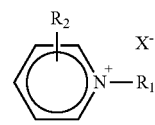

or

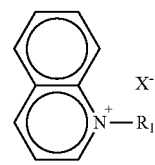

wherein, $R_1$ is a hydrogen atom or an alkyl or aralkyl group which optionally contains a hydroxyl group, a carbamoyl group, an ether bond, or an unsaturated bond; $R_2$ is a hydrogen atom or a lower alkyl group; and $X^-$ is a halide ion, a phosphate ion, a p-toluenesulfonate ion, a methyl sulfate ion, an ethyl sulfate ion, or mixture of two or more of said ions,

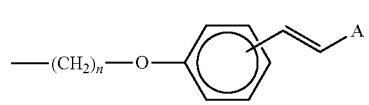

wherein A represents:

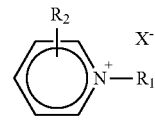

or

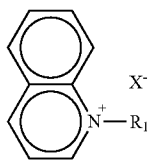

wherein, $R_1$ is a hydrogen atom or an alkyl or aralkyl group which optionally contains a hydroxyl group, a carbamoyl group, an ether bond, or an unsaturated bond; $R_2$ is a hydrogen atom or a lower alkyl group; and $X^-$ is a halide ion, a phosphate ion, a p-toluenesulfonate ion, a methyl sulfate ion, an ethyl sulfate ion, or mixture of two or more of said ions, the method comprising:

adding a photosensitive compound to a water-based, water-processable, non-saponified, and non-hydrolyzed vinyl acetate polymer in the presence of an acid catalyst, the photosensitive compound selected from a group consisting of:

(1) at least one compound selected from the group consisting of styrylpyridinium compound and a styrylquinolinium compound, possessing a formyl group and represented by a respective formula in the following formula:

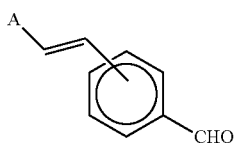

wherein A is:

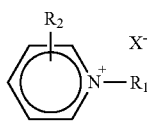

or

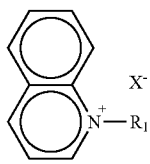

wherein, $R_1$ is a hydrogen atom, an alkyl group, or a lower hydroxyalkyl; $R_2$ is a hydrogen or an alkyl group; and $X^-$ is a strong acidic ion, and (2) at least one compound selected from the group consisting of a styrylpyridinium compound and a styrylquinolinium compound, possessing an acetal group and represented by a respective formula in the following formulae:

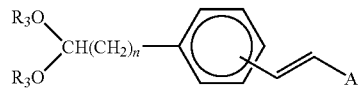

wherein A represents:

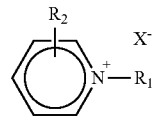

or

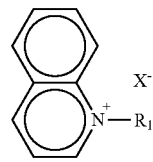

wherein, $R_1$ is a hydrogen atom, an alkyl group, or an aralkyl group; $R_2$ is a hydrogen atom or an alkyl group; two $R_3$ are each selected from a group consisting of an alkyl group and a phenyl group or are combined forming an alkenyl group n is an integer having a value between 1 and 6 inclusive; and $X^-$ is a strong acidic ion.

6. The method according to claim 5, wherein the $X^-$ is selected from a group consisting of a halogen ion, a sulfate ion, a phosphate ion, and a p-toluene sulfonate ion.

7. The method according to claim 5, wherein the (1) at least one compound selected from the group consisting of the styrylpyridinium compound and the styrylquinolinium compound, possessing the formyl group is used in a proportion in a range from 0.01 to 5 mol % relative to one vinyl acetate unit.

8. The method according to claim 5, wherein the (2) at least one compound selected from the group consisting of the styrylpyridinium compound and the styrylquinolinium compound, possessing the acetal group is used in a proportion in a range from 0.01 to 5 mol % relative to one vinyl acetate unit.

9. The method according to claim 5, wherein said acid catalyst is hydrochloric acid, sulfuric acid, phosphoric acid, perchloric acid, hydroborofluoric acid, methanesulfonic acid, or p-toluenesulfonic acid.

10. The method according to claim 5, wherein a reaction of the added photosensitive compound and the water-based, water-processable, non-saponified, and non-hydrolyzed PVAc is conducted at a temperature in a range from room temperature to 100° C.

11. The method according to claim 5, wherein the water-based, water-processable, non-saponified, and non-hydrolyzed PVAc is present in a concentration in a range from 10 to 55 W/W %.

* * * * *